(12) United States Patent
Ashwood (10) Patent No.: US 11,809,021 B2
(45) Date of Patent: *Nov. 7, 2023

(54) WEARABLE DEVICE WITH HEAT TRANSFER PATHWAY

(71) Applicant: Snap Inc., Santa Monica, CA (US)

(72) Inventor: Andrea Ashwood, Los Angeles, CA (US)

(73) Assignee: Snap Inc., Santa Monica, CA (US)

( * ) Notice: Subject to any disclaimer, the term of this patent is extended or adjusted under 35 U.S.C. 154(b) by 96 days.

This patent is subject to a terminal disclaimer.

(21) Appl. No.: 17/360,508

(22) Filed: Jun. 28, 2021

(65) Prior Publication Data
US 2021/0325691 A1 Oct. 21, 2021

Related U.S. Application Data

(63) Continuation of application No. 16/396,030, filed on Apr. 26, 2019, now Pat. No. 11,086,140, which is a
(Continued)

(51) Int. Cl.
*G02C 5/00* (2006.01)
*G02C 11/00* (2006.01)
(Continued)

(52) U.S. Cl.
CPC ............ *G02C 5/001* (2013.01); *G02B 27/017* (2013.01); *G02C 5/14* (2013.01); *G02C 5/143* (2013.01);
(Continued)

(58) Field of Classification Search
None
See application file for complete search history.

(56) References Cited

U.S. PATENT DOCUMENTS 6,038,295 A 3/2000 Mattes
6,980,909 B2 12/2005 Root et al.
(Continued)

FOREIGN PATENT DOCUMENTS

CA 2887596 A1 7/2015
CN 102906623 A 1/2013
(Continued)

OTHER PUBLICATIONS

"U.S. Appl. No. 16/037,844, PTO Response to Rule 312 Communication dated Jan. 13, 2021", 2 pgs.
(Continued)

*Primary Examiner* — Darryl J Collins
(74) *Attorney, Agent, or Firm* — Schwegman Lundberg & Woessner, P.A.

(57) ABSTRACT

A wearable device can include an eyewear body, onboard electronic components, a thermal coupling and a heat transfer device. The eyewear body can hold one or more optical elements mounted on the eyewear body within a field of view of the user. The onboard electronic components can be carried by the eyewear body at a first portion of the eyewear body and can comprise a heat source that generates heat during electrically powered operation thereof. The thermal coupling can be thermally coupled to the heat transfer device at a second portion of the eyewear body. The elongate heat transfer device can be disposed within the eyewear body and can be thermally coupled to the heat source and the thermal coupling. The heat transfer device can extend lengthwise between the heat source and the thermal coupling to transfer heat from the heat source to the thermal coupling.

19 Claims, 4 Drawing Sheets

Related U.S. Application Data continuation of application No. 15/648,037, filed on Jul. 12, 2017, now Pat. No. 10,317,700, which is a continuation of application No. 15/084,683, filed on Mar. 30, 2016, now Pat. No. 9,740,023.

(60) Provisional application No. 62/301,061, filed on Feb. 29, 2016.

(51) Int. Cl.
| | |
|---|---|
| *H05K 7/20* | (2006.01) |
| *G02B 27/01* | (2006.01) |
| *G02C 5/22* | (2006.01) |
| *G06F 1/16* | (2006.01) |
| *G02C 5/14* | (2006.01) |

(52) U.S. Cl.
CPC ............. *G02C 5/22* (2013.01); *G02C 11/10* (2013.01); *G06F 1/163* (2013.01); *H05K 7/2039* (2013.01); *H05K 7/20445* (2013.01); *G02B 2027/0138* (2013.01); *G02B 2027/0178* (2013.01)

(56) References Cited

U.S. PATENT DOCUMENTS

| | | | |
|---|---|---|---|
| 7,173,651 | B1 | 2/2007 | Knowles |
| 7,411,493 | B2 | 8/2008 | Smith |
| 7,535,890 | B2 | 5/2009 | Rojas |
| 7,974,090 | B2 | 7/2011 | Risher-Kelly |
| 8,131,597 | B2 | 3/2012 | Hudetz |
| 8,199,747 | B2 | 6/2012 | Rojas et al. |
| 8,332,475 | B2 | 12/2012 | Rosen et al. |
| 8,718,333 | B2 | 5/2014 | Wolf et al. |
| 8,724,622 | B2 | 5/2014 | Rojas |
| 8,874,677 | B2 | 10/2014 | Rosen |
| 8,909,679 | B2 | 12/2014 | Root et al. |
| 8,995,433 | B2 | 3/2015 | Rojas |
| 9,040,574 | B2 | 5/2015 | Wang et al. |
| 9,055,416 | B2 | 6/2015 | Rosen et al. |
| 9,100,806 | B2 | 8/2015 | Rosen et al. |
| 9,100,807 | B2 | 8/2015 | Rosen et al. |
| 9,191,776 | B2 | 11/2015 | Root et al. |
| 9,204,252 | B2 | 12/2015 | Root |
| 9,423,842 | B2 | 8/2016 | Osterhout et al. |
| 9,443,227 | B2 | 9/2016 | Evans et al. |
| 9,469,661 | B2 | 11/2016 | Evans et al. |
| 9,482,882 | B1 | 11/2016 | Hanover et al. |
| 9,482,883 | B1 | 11/2016 | Meisenholder |
| 9,491,134 | B2 | 11/2016 | Rosen |
| 9,740,023 | B1 | 8/2017 | Ashwood |
| 9,746,692 | B1 | 8/2017 | Streets et al. |
| 9,851,585 | B2 | 12/2017 | Ashwood |
| 10,042,187 | B2 | 8/2018 | Ashwood et al. |
| 10,317,700 | B1 | 6/2019 | Ashwood et al. |
| 10,345,617 | B1 | 7/2019 | Streets et al. |
| 10,379,377 | B2 | 8/2019 | Ashwood |
| 10,928,658 | B1 | 2/2021 | Ashwood et al. |
| 11,086,140 | B1 | 8/2021 | Ashwood |
| 2004/0130870 | A1 | 7/2004 | Fleck et al. |
| 2006/0232929 | A1 | 10/2006 | Huang et al. |
| 2008/0198324 | A1 | 8/2008 | Fuziak et al. |
| 2010/0309426 | A1 | 12/2010 | Howell et al. |
| 2011/0202598 | A1 | 8/2011 | Evans et al. |
| 2011/0221656 | A1 | 9/2011 | Haddick et al. |
| 2012/0155064 | A1 | 6/2012 | Waters |
| 2012/0209924 | A1 | 8/2012 | Evans et al. |
| 2013/0201440 | A1 | 8/2013 | Howell et al. |
| 2014/0259271 | A1 | 9/2014 | Cox et al. |
| 2014/0361081 | A1 | 12/2014 | Glanzer et al. |
| 2014/0368544 | A1 | 12/2014 | Kobayashi |
| 2015/0200554 | A1 | 7/2015 | Marks et al. |
| 2016/0041395 | A1 | 2/2016 | Yajima |
| 2016/0212888 | A1 | 7/2016 | Nikkhoo et al. |
| 2016/0252727 | A1 | 9/2016 | Mack et al. |
| 2017/0172542 | A1 | 6/2017 | Lee et al. |
| 2017/0248799 | A1 | 8/2017 | Streets et al. |
| 2017/0248801 | A1 | 8/2017 | Ashwood |
| 2018/0074343 | A1 | 3/2018 | Ashwood |
| 2018/0136491 | A1 | 5/2018 | Ashwood et al. |

FOREIGN PATENT DOCUMENTS

| | | |
|---|---|---|
| CN | 102947746 A | 2/2013 |
| CN | 203369502 U | 1/2014 |
| CN | 204291250 U | 4/2015 |
| CN | 108885358 A | 11/2018 |
| CN | 108885358 | 1/2021 |
| CN | 112684606 | 4/2021 |
| CN | 112684606 B | 8/2022 |
| CN | 115220237 A | 10/2022 |
| KR | 102113287 B1 | 5/2020 |
| KR | 102194287 | 12/2020 |
| KR | 102277917 | 7/2021 |
| WO | WO-0135159 A1 | 5/2001 |
| WO | WO-2011149364 A1 | 12/2011 |
| WO | WO-2017151519 A1 | 9/2017 |
| WO | WO-2018145085 A1 | 8/2018 |

OTHER PUBLICATIONS

"Korean Application Serial No. 10-2020-7013848, Office Action dated Apr. 27, 2021", 2 pgs.

"U.S. Appl. No. 16/396,030, 312 Amendment filed Jun. 30, 2021", 3 pgs.

"U.S. Appl. No. 16/396,030, PTO Response to Rule 312 Communication dated Jul. 12, 2021", 2 pgs.

"U.S. Appl. No. 15/073,856, Non Final Office Action dated Mar. 9, 2017", 7 pgs.

"U.S. Appl. No. 15/073,856, Notice of Allowance dated Aug. 25, 2017", 9 pgs.

"U.S. Appl. No. 15/073,856, Response filed May 22, 2017 to Non Final Office Action dated Mar. 9, 2017", 9 pgs.

"U.S. Appl. No. 15/084,683, Corrected Notice of Allowance dated Jun. 20, 2017", 4 pgs.

"U.S. Appl. No. 15/084,683, Non Final Office Action dated Dec. 1, 2016", 11 pgs.

"U.S. Appl. No. 15/084,683, Notice of Allowance dated Apr. 12, 2017", 7 pgs.

"U.S. Appl. No. 15/084,683, PTO Response to Rule 312 Communication dated Jun. 30, 2017", 2 pgs.

"U.S. Appl. No. 15/084,683, Response filed Feb. 28, 2017 to Non Final Office Action dated Dec. 1, 2016", 10 pgs.

"U.S. Appl. No. 15/086,233, Non Final Office Action dated Dec. 21, 2016", 12 pgs.

"U.S. Appl. No. 15/086,233, Notice of Allowance dated Apr. 24, 2017", 7 pgs.

"U.S. Appl. No. 15/086,233, Response filed Mar. 16, 2017 to Non Final Office Action dated Dec. 21, 2016", 9 pgs.

"U.S. Appl. No. 15/425,774, Notice of Allowance dated Apr. 12, 2018", 12 pgs.

"U.S. Appl. No. 15/648,037, Non Final Office Action dated Sep. 10, 2018", 7 pgs.

"U.S. Appl. No. 15/648,037, Notice of Allowance dated Jan. 31, 2019", 8 pgs.

"U.S. Appl. No. 15/648,037, Responsse filed Dec. 10, 2018 to Non Final Office Action dated Sep. 10, 2018", 11 pgs.

"U.S. Appl. No. 15/654,441, Corrected Notice of Allowability dated Mar. 26, 2019", 3 pgs.

"U.S. Appl. No. 15/654,441, Non Final Office Action dated Oct. 12, 2018", 10 pgs.

"U.S. Appl. No. 15/654,441, Notice of Allowance dated Feb. 25, 2019", 8 pgs.

"U.S. Appl. No. 15/654,441, Response filed Jan. 8, 2019 to Non Final Office Action dated Oct. 12, 2018", 15 pgs.

"U.S. Appl. No. 15/818,458, Non Final Office Action dated Nov. 29, 2018", 10 pgs.

(56) References Cited

OTHER PUBLICATIONS

"U.S. Appl. No. 15/818,458, Notice of Allowance dated Mar. 29, 2019", 9 pgs.

"U.S. Appl. No. 15/818,458, Response filed Feb. 8, 2019 to Non Final Office Action dated Nov. 29, 2018", 13 pgs.

"U.S. Appl. No. 16/037,844, Final Office Action dated Jul. 20, 2020", 6 pgs.

"U.S. Appl. No. 16/037,844, Non Final Office Action dated Jan. 15, 2020", 5 pgs.

"U.S. Appl. No. 16/037,844, Non Final Office Action dated Sep. 16, 2019", 9 pgs.

"U.S. Appl. No. 16/037,844, Notice of Allowance dated Oct. 6, 2020", 9 pgs.

"U.S. Appl. No. 16/037,844, Preliminary Amendment filed Aug. 10, 2018 t", 7 pgs.

"U.S. Appl. No. 16/037,844, Response filed Apr. 9, 2020 to Non Final Office Action dated Jan. 15, 2020", 9 pgs.

"U.S. Appl. No. 16/037,844, Response filed Sep. 16, 2020 to Final Office Action dated Jul. 20, 2020", 9 pgs.

"U.S. Appl. No. 16/037,844, Response filed Dec. 12, 2019 to Non Final Office Action dated Sep. 16, 2019", 9 pgs.

"U.S. Appl. No. 16/396,030, Final Office Action dated Feb. 2, 2021", 8 pgs.

"U.S. Appl. No. 16/396,030, Non Final Office Action dated May 26, 2020", 9 pgs.

"U.S. Appl. No. 16/396,030, Non Final Office Action dated Sep. 21, 2020", 8 pgs.

"U.S. Appl. No. 16/396,030, Notice of Allowance dated Apr. 5, 2021", 7 pgs.

"U.S. Appl. No. 16/396,030, Preliminary Amendment filed May 16, 2019", 7 pgs.

"U.S. Appl. No. 16/396,030, Response filed Mar. 24, 2021 to Final Office Action dated Feb. 2, 2021".

"U.S. Appl. No. 16/396,030, Response filed Aug. 24, 2020 to Non Final Office Action dated May 26, 2020", 10 pgs.

"U.S. Appl. No. 16/396,030, Response filed Dec. 10, 2020 to Non Final Office Action dated Sep. 21, 2020", 10 pgs.

"Chinese Application Serial No. 201780013926.6, Office Action dated Jul. 27, 2020", w/ English Translation, 9 pgs.

"Chinese Application Serial No. 201780013926.6, Office Action dated Aug. 29, 2019", w/ English Translation, 14 pgs.

"Chinese Application Serial No. 201780013926.6, Office Action dated Dec. 18, 2019", w/ English Translation, 14 pgs.

"Chinese Application Serial No. 201780013926.6, Response filed Jan. 15, 2020 to Office Action dated Dec. 18, 2019", w/ English Claims, 18 pgs.

"Chinese Application Serial No. 201780013926.6, Response filed Aug. 17, 2020 to Office Action dated Jul. 27, 2020", w/ English Translation, 18 pgs.

"Chinese Application Serial No. 201780013926.6, Response filed Oct. 17, 2019 to Office Action dated Aug. 29, 2019", w/o English Claims, 6 pgs.

"Chinese Application Serial No. 201780013926.6, Response to Examiners Telephone Interview filed Feb. 25, 2020", w/ English Claims, 16 pgs.

"Chinese Application Serial No. 201780013926.6, Voluntary Amendment Filed Mar. 7, 2019", w/ English Claims, 24 pgs.

"European Application Serial No. 17710102.9, Response to Communication Pursuant to Rules 161(1) and 162 EPC dated Oct. 12, 2018", w/ English Claims, 52 pgs.

"International Application Serial No. PCT/US2017/019740, International Preliminary Report on Patentability dated Sep. 13, 2018", 11 pgs.

"International Application Serial No. PCT/US2017/019740, International Search Report dated Jun. 2, 2017", 5 pgs.

"International Application Serial No. PCT/US2017/019740, Written Opinion dated Jun. 2, 2017", 9 pgs.

"International Application Serial No. PCT/US2018/017059, International Preliminary Report on Patentability dated Aug. 15, 2019", 12 pgs.

"International Application Serial No. PCT/US2018/017059, International Search Report dated May 24, 2018", 8 pgs.

"International Application Serial No. PCT/US2018/017059, Written Opinion dated May 24, 2018", 18 pgs.

"Korean Application Serial No. 10-2018-7028041, Notice of Preliminary Rejection dated Aug. 24, 2019", w/ English translation, 16 pgs.

"Korean Application Serial No. 10-2018-7028041, Response filed Oct. 24, 2019 to Notice of Preliminary Rejection dated Aug. 24, 2019", w/ English Claims, 32 pgs.

"Korean Application Serial No. 10-2020-7013848, Notice of Preliminary Rejection dated Jun. 19, 2020", w/ English Translation, 15 pgs.

"Korean Application Serial No. 10-2020-7013848, Response filed Aug. 19, 2020 to Notice of Preliminary Rejection dated Jun. 19, 20", w/ English Translation, 16 pgs.

Leyden, John, "This SMS will self-destruct in 4Q seconds", [Online] Retrieved from the Internet: <URL: http://www.theregister.co.uk/2005/12/12/stealthtext/>, (Dec. 12, 2005), 1 pg.

Lin, Jun, "Eyewear with conductive Temple Joint", U.S. Appl. No. 14/869,149 filed Sep. 29, 2015, (Sep. 29, 2015), 33 pgs.

"Chinese Application Serial No. 202110010139.4, Office Action dated Oct. 9, 2021", w/ English translation, 18 pgs.

"European Application Serial No. 17710102.9, Communication Pursuant to Article 94(3) EPC dated Jan. 5, 2022", 4 pgs.

"Chinese Application Serial No. 202110010139.4, Response Filed Jan. 27, 2022 to Office Action dated Oct. 9, 2021", w/ English Claims, 26 pgs.

"Chinese Application Serial No. 202110010139.4, Office Action dated Apr. 2, 2022", w/ English translation, 5 pgs.

"Chinese Application Serial No. 202110010139.4, Response Filed Jun. 15, 2022 to Office Action dated Apr. 2, 2022", w/ English Claims, 24 pgs.

"European Application Serial No. 17710102.9, Response filed May 13, 2022 to Office Action dated Jan. 5, 2022", 3 pgs.

"Korean Application Serial No. 10-2021-7021638, Notice of Preliminary Rejection dated Jun. 27, 2022", w/ English Translation, 12 pgs.

"Korean Application Serial No. 10-2021-7021638, Notice of Preliminary Rejection dated Dec. 16, 2022", w/ English Translation, 4 pgs.

"Korean Application Serial No. 10-2021-7021638, Response filed Aug. 17, 2022 to Notice of Preliminary Rejection dated Jun. 27, 2022", w/ English Claims, 22 pgs.

WEARABLE DEVICE WITH HEAT TRANSFER PATHWAY

CLAIM OF PRIORITY

This application is a continuation of and claims the benefit of priority to U.S. patent application Ser. No. 16/396,030, filed Apr. 26, 2019, which is a continuation and claims the benefit of priority to U.S. patent application Ser. No. 15/648,037, filed Jul. 12, 2017, which is a continuation and claims the benefit of priority to U.S. patent application Ser. No. 15/084,683, filed Mar. 30, 2016, which claims the benefit of priority to U.S. Provisional Application Ser. No. 62/301,061, filed Feb. 29, 2016, each of which are hereby incorporated by reference in their entireties.

TECHNICAL FIELD

The subject matter disclosed herein generally relates to heat management in wearable electronic devices such as smart glasses.

BACKGROUND

Many devices, including wearable devices, utilize electronics to perform various functions. Heat management for such electronics, to keep the electronics within a heat range corresponding to acceptable performance, can be problematic owing for example to space and weight constraints of a wearable device of which the electronics form part, as well as by the fact that some such devices can be worn in contact with the user's body.

BRIEF DESCRIPTION OF THE DRAWINGS

The present disclosure is illustrated by way of example, and not by way of limitation, in the figures of the accompanying drawings, in which.

OVERVIEW

A brief overview of some aspects of the disclosure with reference to selected drawings follows, after which various features of the disclosed subject matter will be described in greater detail.

Figure 1:
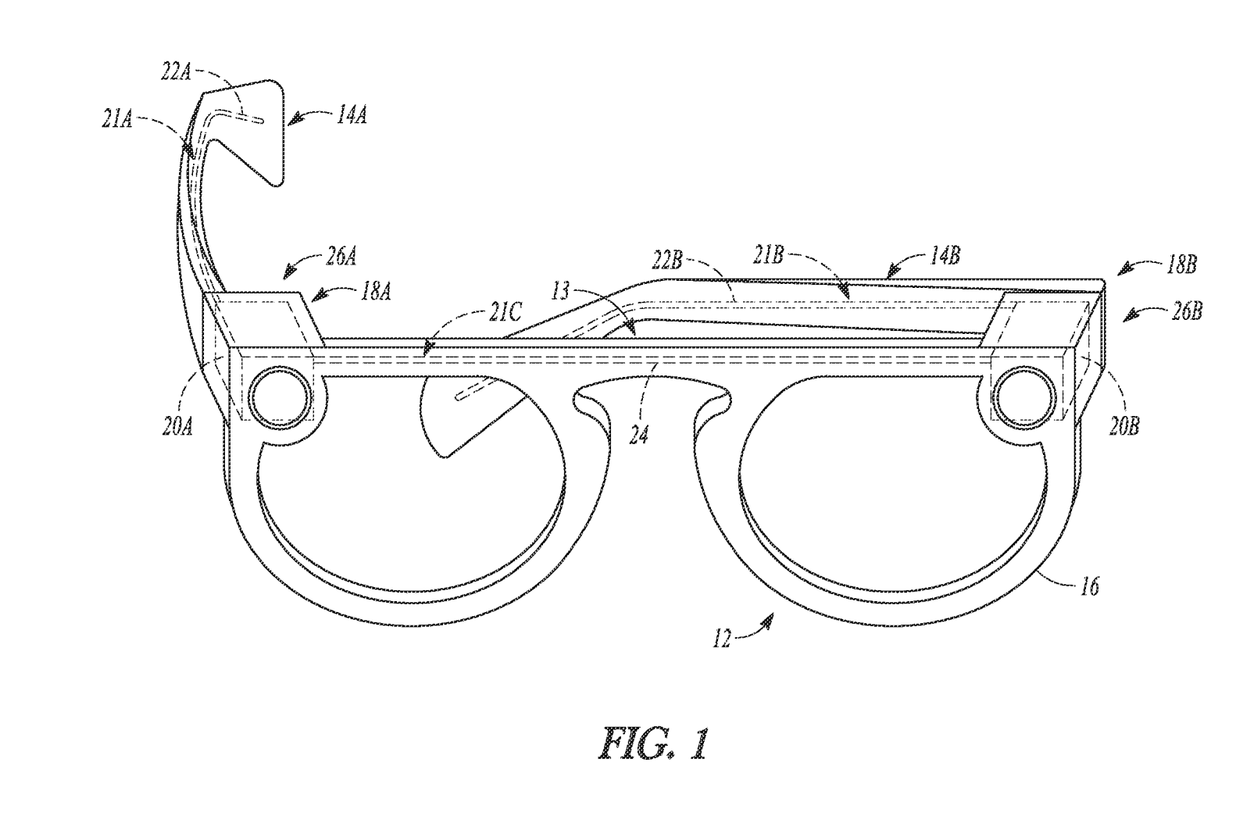
FIG. 1 is a perspective view of eyewear comprising a wearable electronic device including temples, a frame, onboard electronic components and at least one heat transfer device according to one embodiment.
Figure 2:
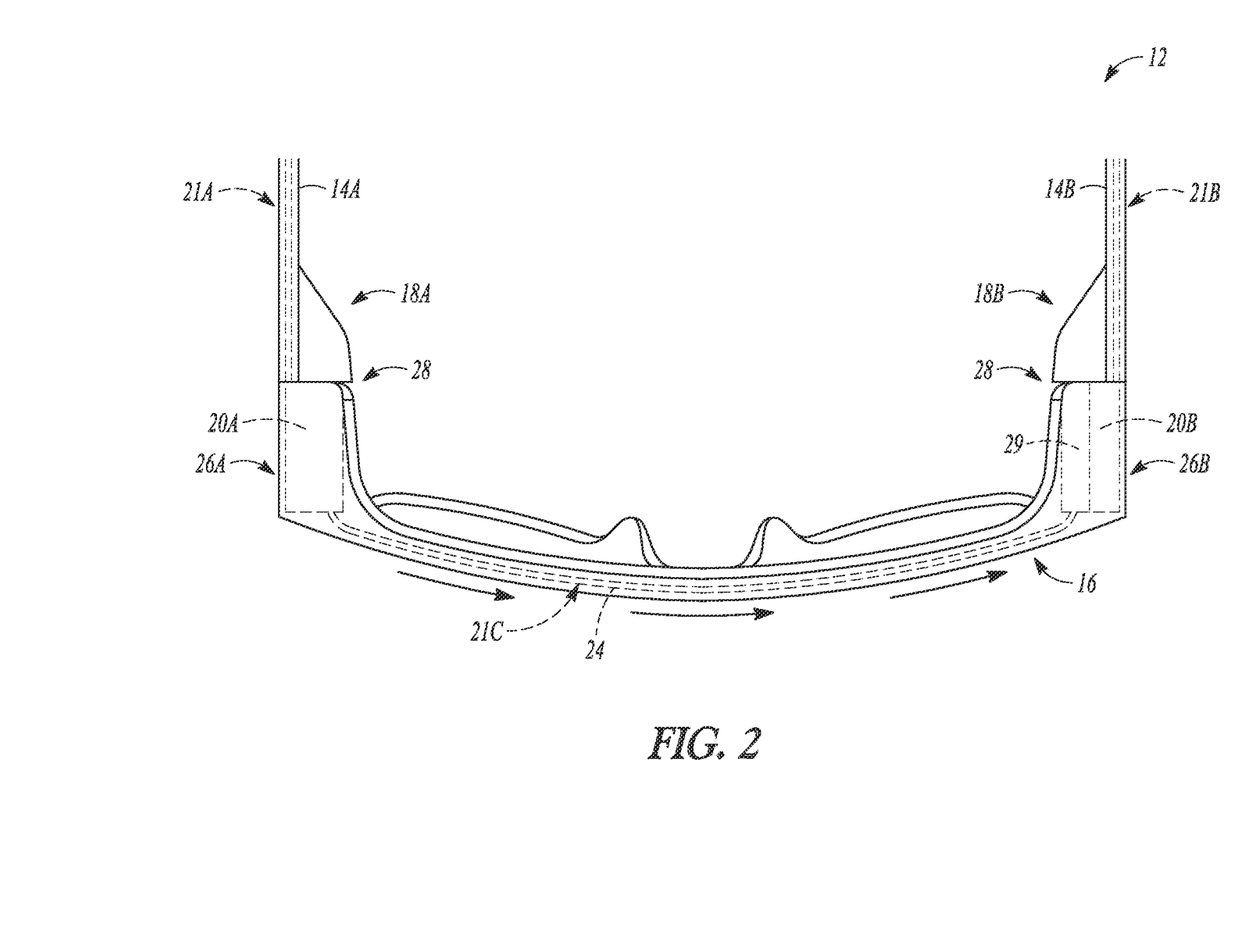
FIG. 2 shows a plan view of the eyewear from FIG. 1 illustrating the heat transfer device housed in the frame and extending from one side of the frame to a second side of the frame according to one embodiment.

One aspect of this disclosure relates to a wearable device such as an eyewear article with onboard electronic components such as a camera, a processor, WiFi, Bluetooth®, and various modules as is shown in FIGS. 1 to 4. As such, the eyewear article comprises smart glasses. The onboard electronic components can be carried by a body of the smart glasses, such as in the frame as illustrated in FIGS. 1 to 2, or in the temple(s). The onboard electronic components can generate relatively large amounts of heat during electrically powered operation, given volume constraints for the smart glasses. For smart glasses, it is generally desirable for the onboard electronics components to be carried (e.g., housed) in a manner that does not make the smart glasses unsightly or ungainly for the user. Although these criteria may be satisfied by making the onboard electronic components and/or the housing for those components smaller, such reduction in size/volume and corresponding reduction in surface area can pose heat management problems. Inadequate heat transfer away from the electronics can eventually lead to failure or mal-performance of the onboard electronics components and/or can lead to undesirable external surface heating of the smart glasses. Such external surface heating can have undesired effects, e.g., by causing discomfort to the user or by creating a perception on the part of the user that the onboard electronics components are being overworked.

One aspect of the disclosure comprises utilizing a heat transfer device to transfer heat generated by the onboard electronic components away therefrom (and away from the face of the user), so as to reduce the likelihood of localized heating adjacent the onboard electronic components and heating adjacent the user's face. In some embodiments, the heat transfer device can extend laterally across a frame of the smart glasses, extending from one side of the frame to the other side of the frame. Thus, heat generated by the onboard electronics components carried in a first side portion of the frame can be transferred to a second side portion of the frame, where the heat can be dissipated as shown in FIGS. 1 and 2. According to various embodiments, the heat transfer device can be a heat pipe (e.g., FIG. 4), a heat sink (FIG. 3) and/or a core wire (FIGS. 1-3).

In some embodiments, the smart glasses that can provide for a thermal coupling between different components of the smart glasses (e.g., between a temple and the frame). More particularly, the thermal coupling can extend across an articulated joint (e.g., a hinge assembly) between the temple and the frame to provide part of a heat conduction path from onboard electronic components in the frame to the core wire of the temple, as shown in the embodiment of FIG. 3.

Figure 3:
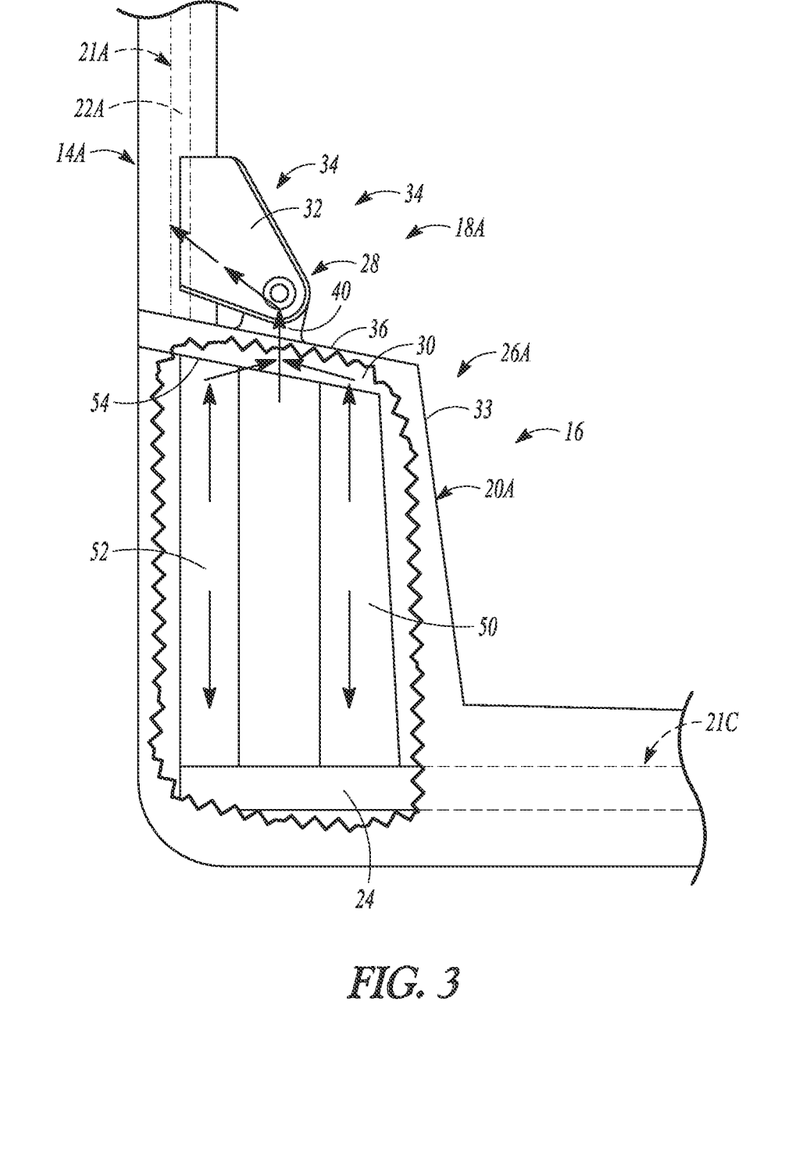
FIG. 3 is a plan view of a portion of the frame housing the electronic components and further illustrating the heat transfer device from the electronic components through the frame according to one embodiment.
Figure 4:
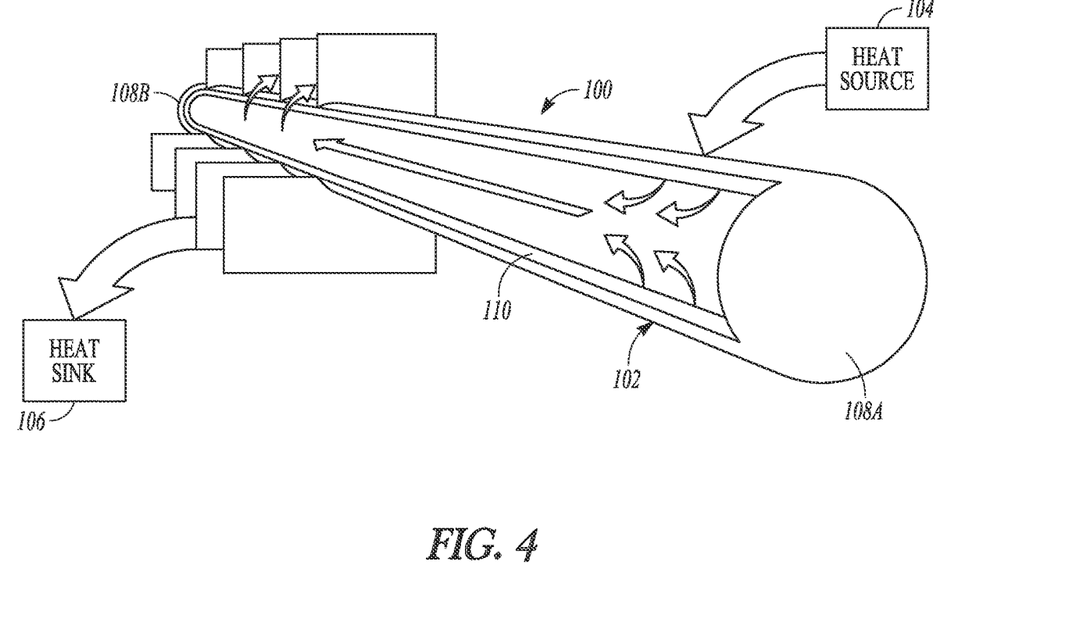
FIG. 4 is a schematic view of the heat transfer pathway comprising a heat pipe according to one embodiment.

Further, the inventor proposes a cap hinge that can be part of the housing of the frame as well as being part of the hinge assembly (e.g., FIGS. 2-4). As shown in FIG. 3, the cap hinge can be abutted along one or more internal surfaces disposed within the frame in a conductive heat exchange relationship by one or more heat sinks internal to the frame. These internal heat sinks can carry the onboard electronics components thereon.

Thus, according to examples herein, multiple heat transfer pathways can be formed to transfer the heat generated during operation of the onboard electronics components (heat sources) to various components and/or portions of the smart glasses where it can be dissipated.

In some examples, the onboard electronic components may be carried by the frame alone. In other embodiments, the electronic components may be carried by on or more of the temples. In yet further embodiments, the electronic components may be carried by both the frame and at least one of the temples. Similarly, the heat transfer device can be part of the temple(s) (FIG. 3) and/or part of the frame (e.g., FIGS. 1 and 2). In some embodiments, the onboard electronic components can be disposed on both the left and right lateral portions of the frame, and each temple can contain a respective heat transfer device that can be thermally coupled to corresponding onboard electronic components. In yet further embodiments, the electronic components or a majority of the electronic components that produce a majority of the heat can be disposed on only the first side portion of the frame (e.g., the left side end portion) and the heat transfer device can extend across the frame from the first side portion to the second side portion (e.g., the right side end portion). At least a portion of the heat generated by the onboard electronics components carried in the first side portion can be transferred to second side portion where the heat can be dissipated. In some embodiments, at the second side portion, the heat transfer device can thermally couple with a thermal coupling (e.g., a second target heat receiving component such as a core wire, a heat pipe, heat sink, an electronics carrier, or the like) that can further facilitate transfer of the heat to other components of the smart glasses such as a second temple.

In some embodiments, the smart glasses can be operable (i.e. are electrically powered) even in a collapsed condition where one or more of the temples are folded towards the frame to a non-wearable position for the user. In such a collapsed condition, as well as in a wearable condition where one or both of the temples are extended so as to be received around a user's face, the onboard electronic components can run software and perform other tasks that can improve the glasses' efficiency and performance. The thermal coupling between the temple and the frame and the one or more heat transfer devices can be configured to transfer heat away from the electronic components both when the temple(s) is in the wearable condition and when the temple is in the collapsed condition.

DETAILED DESCRIPTION

The description that follows includes apparatuses, systems, and techniques that embody illustrative embodiments of the disclosure. In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known structures and techniques are not necessarily shown in detail. Certain embodiments described in detail herein may be referred to as examples.

Embodiments described herein relate to apparatuses and techniques that allow smart glasses to that can transfer heat away from onboard electronic components (and the face of the user) in a more desirable manner. This can make the smart glasses as more reliable and wearable.

This disclosure applies to smart glasses (e.g., those that have electronics carried thereby). Smart glasses include onboard electronic components such as a power source, power and communication related circuitry, communication devices (e.g., a camera, a microphone, sensors, etc.), display devices, a computer, a memory, modules, and/or the like.

Regarding the construction of the smart glasses itself, according to one example, the smart glasses comprise an eyewear body configured for wearing by a user to hold one or more optical elements mounted on the eyewear body within a field of view of the user. Such optical elements can include not just lenses (as is the case in the embodiments described below), but can in other embodiments include any object that can be held close to the eye and through which or from which light is passed to the eye. As such, the term optical elements includes displays (such as virtual reality displays, augmented reality displays, or other near-eye displays), surfaces such as those of a smartphone or tablet, and lenses, both corrective and non-corrective, for example.

The smart glasses can include the frame and a pair of the temples coupled thereto on opposite ends of the frame at articulated joints. For any one of the temples, the temple is in the wearable configuration or condition when the temple is substantially fully unfolded for reception along a side of the user's head. In contrast, a temple is in the collapsed configuration or condition when that temple is hingedly folded towards the frame. Thus, the smart glasses can be in both the wearable configuration and the collapsed configuration at the same time (e.g., one temple unfolded the other temple folded towards the frame) and the onboard electronics components can be electrically powered so as to be operable in either condition, as previously discussed.

FIG. 1 shows a perspective view of a front of a pair of smart glasses 12. The smart glasses 12 can comprise an eyewear body 13. The eyewear body 13 can include one or more temples 14A and 14B and a frame 16. The smart glasses 12 can additionally include articulated joints 18A and 18B, onboard electronic components 20A and 20B, and heat transfer devices 21A, 21B, 21C. In the example of FIG. 1, the heat transfer devices 21A, 21B can comprise core wires 22A, 22B and the heat transfer device 21C can comprise a heat pipe 24.

The onboard electronic components 20A and 20B can be carried by the eyewear body 13 (e.g., either or both of the temple(s) 14A, 14B and/or the frame 16). The onboard electronic components 20A and 20B can comprise the heat source that generates heat during electrically powered operation. As previously discussed, the onboard electronic components 20A and 20B can comprise a power source, power and communication related circuitry, communication devices (e.g., a camera, a microphone, sensors, etc.), display devices, a computer, a memory, modules, and/or the like.

As will be discussed in further detail herein, the eyewear body 13 can be configured for wearing by a user to hold one or more optical elements mounted on the eyewear body 13 within a field of view of a user. More particularly, the frame 16 can be configured to hold the one or more optical elements, while the temples 14A and 14B can be connected to the frame 16 at the respective articulated joints 18A and 18B. The onboard electronic components 20A and/or 20B can be carried by the eyewear body 13 and can comprise a heat source that generates heat during electrically powered operation thereof. The heat transfer device 21A, 21B, and/or 21C can be disposed within the eyewear body 13 and can be thermally coupled to the heat source at a first portion of the eyewear body 13 (e.g., a right side portion 26A). The heat transfer device 21A, 21B, and/or 21C can extend to a second portion of the eyewear body 13 (e.g., a second end portion 26B) and can be configured to move at least a portion of the heat from the heat source (the onboard electronic components 20A and/or 20B) to the second portion of the eyewear body 13. In the embodiment of FIG. 1, the heat transfer devices 21A and 21B can comprise core wires 22A and 22B configured to form part of a structural framework for at least part of the eyewear body 13 (e.g., a structural framework of the temples 14A and 14B).

The temple 14A is illustrated in the wearable condition while the temple 14B is illustrated in the collapsed condition in FIG. 1. As shown in FIG. 1, the temple 14A can be connected to a right side portion 26A (i.e. the right side end portion) of the frame 16 by the articulated joint 18A. Similarly, the temple 14B can be connected to a second end portion 26B (i.e. the left side end portion) of the frame 16 by the articulated joint 18B. According to the example of FIG.

1, the right side portion 26A of the frame 16 can carry the onboard electronic components 20A by housing the onboard electronic components 20A therein, and the second end portion 26B can carry the onboard electronic components 20B by housing the onboard electronic components 20B therein.

According to the embodiment of FIG. 1, one or both of the core wires 22A and 22B can be used as the heat transfer devices 21A and 21B as will be discussed in further detail subsequently. The temples 14A and 14B can comprise elongate members having core wires 22A and 22B extending therein. The core wire 22A can comprise a portion of the temple 14A (e.g., can be embedded within a plastics material or other material that comprises an outer cap of the temple 14A) and can extend from adjacent the articulated joint 18A toward a second lateral portion of the temple 14A. Similarly, the core wire 22B can comprise a portion of the temple 14B (e.g., can be embedded within a plastics material or other material that comprises an outer cap of the temple 14B) and can extend from adjacent the articulated joint 18B toward a second lateral portion of the temple 14B.

The heat transfer device 21C can be thermally coupled to the onboard electronic components 20A and/or 20B. More particularly, the heat transfer device 21C can be located within the frame 16 and can extend laterally along the frame 16 from the right side portion 26A (adjacent a first of the one or more optical elements) to the second end portion 26B (adjacent a second of the one or more optical elements). The heat transfer device 21C can be the heat pipe 24 as further described herein in reference to FIG. 4. Thus, the heat pipe 24 can extend from the right side portion 26A (terminating at or immediately adjacent the onboard electronic components 20A) to the second end portion 26B (terminating adjacent the onboard electronic components 20B). In other embodiments, the heat transfer device 21C can comprise another component that can form a heat transfer pathway known in the art such as a heat sink, a core wire, or the like.

The heat transfer device 21C can transfer at least a portion of the heat produced by a heat source (the onboard electronic components 20A) from the right side portion 26A to the second end portion 26B where the heat can be dissipated. As will be illustrated in FIG. 2, in some cases the left side portion 26B can be configured to house a thermal coupling (e.g., a heat conductive component or second heat pipe, or the like). The heat transfer device 21C can be thermally coupled to the thermal coupling at the left side portion 26B.

The temples 14A, 14B and the frame 16 can be constructed of a plastics material, cellulosic plastic (e.g., cellulosic acetate), an eco-plastic material, a thermoplastic material, or the like in addition to the heat transfer devices 21A, 21B, and/or 21C. As discussed previously, the core wires 22A, 22B can act to provide structural integrity to the eyewear body 13 (i.e. the temple(s) 14A, 14B and/or the frame 16). Additionally, the core wires 22A, 22B can act as the heat transfer device 21A, 21B (e.g., a heat sink) to transfer the heat generated by the onboard electronic components 20A and/or 20B away therefrom so as to reduce the likelihood of localized heating adjacent the onboard electronic components 20A and/or 20B. As such, the core wires 22A, 22B (and/or the heat pipe 24) can be thermally coupled to the heat source to provide a heat transfer pathway for the heat source. The core wires 22A, 22B can be constructed of a relatively flexible conductive metal or metal alloy material such as one or more of an aluminum, an alloy of aluminum, alloys of nickel-silver, and a stainless steel, for example.

The temple 14A and core wire 22A can extend generally rearward from a rear facing surface of the right side portion 26A of the frame 16. According to the illustrated example of FIGS. 1-3, the articulated joint 18A can comprise a hinge assembly 28 (FIGS. 2 and 3) that includes hinge projections configured to mate with one another as illustrated and discussed subsequently in reference to FIGS. 2 and 3. According to other embodiments, the articulated joint 18A can comprise a linkage assembly, a ball joint assembly, a male/female assembly, or another type of mechanical connection that allows for movement of the temple 14A relative to the frame 16.

As will be illustrated subsequently, the articulated joint 18A can also be formed as part of the frame 16 and the temple 14A. Indeed, the articulated joint 18A can be configured to provide for movement of the temple 14A relative to the frame 16. Thus, the articulated joint 18A allows for movement of the temple 14A such that it is disposable between the collapsed condition and the wearable configuration as illustrated in FIG. 1.

FIG. 2 shows a top view of the smart glasses 12. FIG. 2 illustrates many of the components and features discussed in reference to FIG. 1. For example, the smart glasses 12 of FIG. 2 can include the temples 14A and 14B, the frame 16, the articulated joints 18A and 18B, the onboard electronic components 20A and 20B, the heat transfer devices 21A and 21B, the heat transfer device 21C (heat pipe 24), and the first and second end portions 26A and 26B discussed previously with reference to FIG. 1. FIG. 2 further illustrates the articulated joints 18A and 18B can comprise the hinge assembly 28. The embodiment of FIG. 2 further illustrates a thermal coupling 29 disposed within the second end portion 26B of the frame 16. Portions of the thermal coupling 29 can extend to and across the articulated joint 18B to the temple 14B as will be discussed subsequently.

As previously discussed with reference to FIG. 1, the heat transfer device 21C (e.g., the heat pipe 24) can be thermally coupled to the onboard electronic components 20A and/or 20B. More particularly, the heat transfer device 21C (e.g., heat pipe 24) can be located within the frame 16 and can extend laterally along the frame 16 from the right side portion 26A (terminating at or immediately adjacent the onboard electronic components 20A) to the second end portion 26B (terminating adjacent the onboard electronic components 20B).

The heat transfer device 21C can transfer at least a portion of the heat produced by a heat source (the onboard electronic components 20A) from the right side portion 26A to the second end portion 26B where the heat can be dissipated (the path of the heat transfer is shown by arrows in FIG. 2). As shown in FIG. 2, the left side portion 26B can be configured to house the thermal coupling 29 in addition to or in alternative to onboard electronic components 20B. The heat transfer device 21C can be thermally coupled to the thermal coupling 29 at the left side portion 26B. The thermal coupling 29 can be further configured to transfer some of the heat from onboard electronic components 20A and/or 20B to the heat transfer device 21B in some embodiments. Indeed, the heat from the onboard electronic components 20A and 20B can be further transferred to the heat transfer devices 21A and/or 21B in the manner discussed subsequently in reference to FIG. 3.

FIG. 3 shows a plan view of the right side portion 26A of the frame 16, the articulated joint 18A, the onboard electronic components 20A, the temple 14A and the core wire 22A. FIG. 3 also illustrates components of the hinge assembly 28 including a cap hinge 30 and a temple hinge 32. While shown in reference to the right side portion 26A, it should be understood that a similar configuration can be used for the second end portion 26A (FIGS. 1 and 2) to create a heat transfer pathway as will be discussed subsequently.

FIG. 3 shows portions of the frame 16 with portions of the housing 33 removed. As shown in the example of FIG. 3, the onboard electronic components 20A are located within the frame 16. Thus, the heat source is located within the frame 16. The heat transfer devices 21A and 21C (e.g., the heat pipe 24 and the core wire 22A) can be thermally coupled to the onboard electronic components 20A. Such coupling can be via by one or more heat sinks 50, 52 internal to the frame 16. The heat sinks 50, 52 can abut the heat transfer devices 21A and 21C either directly or indirectly (e.g., via thermal interface material (TIMs), the cap hinge 30 and the temple hinge 32).

In particular, the onboard electronic components 20A can be housed within a cavity in the right side portion 26A of the frame 16. According to one example, this cavity can encompass a small volume (e.g., the cavity can be is ~17 mm long). Thus, in order to dissipate the heat more evenly and effectively, the heat transfer devices 21A and 21C (e.g., the heat pipe 24 and the core wire 22A) can be used to transfer heat away from the onboard electronic components 20A and a housing 33 that forms and encases the cavity and the onboard electronic components 20A. According to some embodiments, the heat pipe 24 can be configured to be attached directly to one, some, or all of the onboard electronics components 20A in the right side portion 26A to receive heat therefrom. The heat pipe 24 can be routed through the top part of the frame 16 to the second end portion 26B (FIGS. 1 and 2) where the heat can be released to either a heat sink, a core wire (which can act as a heat sink) or to a second heat pipe, for example.

According to the embodiment if FIG. 3, together the components of the hinge assembly 28 can form a thermal coupling 34. The thermal coupling 34 can comprise at least a second heat sink (after the core wire 22A) for the heat source. The thermal coupling 34 can extend between the heat source and the core wire 22A across the articulated joint 16A between the temple 14A and the frame 16. As the thermal coupling 34 can be comprised of components of the hinge assembly 28, the thermal coupling 34 can be configured to conduct heat across the articulated joint 18A both when the temple 14A is in the wearable condition and when the temple is in the collapsed condition.

The cap hinge 30 can form a portion of the thermal coupling 34 and can additionally form a portion of the frame 16 and the hinge assembly 28. More particularly, the cap hinge 30 can have a first portion 36 integrally formed with the housing 33 of the frame 16 and has a second portion 40 comprising a projection extending from the frame 16 and the first portion 36. The cap hinge 30 can be abutted along one or more internal surfaces 54 disposed within the frame 16 in a conductive heat exchange relationship by the one or more heat sinks 50, 52 internal to the frame 16. Similarly, the heat transfer device 21C (e.g., the heat pipe 24) can be abutted by second ends of the one or more heat sinks 50, 52 to form a heat exchange relationship therewith.

The temple hinge 32 can form a portion of the thermal coupling 34 and can additionally form a portion of the temple 14A and the hinge assembly 28. The temple hinge 32 can comprise another heat sink (in addition to at least the core wire 22A and the cap hinge 30). The temple hinge 32 can be coupled to the core wire 22A in a conductive heat exchange relationship. More particularly, according to one example the core wire 22A can be soldered or otherwise connected to the temple hinge 32 in a solid heat conductive manner. The temple hinge 30 can be connected to the cap hinge 32 via a metal screw or fastener (not shown).

FIG. 3 illustrates a conductive heat transfer pathway (illustrated by arrows) where heat generated by electrical powered operation of the onboard electronic components 20A is transferred away therefrom (and away from the face of the user) via one or more heat sinks 50, 52 internal to the frame 16. The heat can be conducted along one pathway to the cap hinge 30, through the screw and the temple hinge 32 to the core wire 22A within the temple 14A. Thus, the thermal coupling 34 can be configured such that the heat from the onboard electronic components 20A can be conducted to the cap hinge 30, through the screw and temple hinge 32 to the core wire 22A within the temple 14A. Heat can also transferred along a second pathway to the heat transfer device 21C and along the heat transfer device 21C to a second side of the smart glasses as discussed previously in reference to FIGS. 1 and 2.

The cap hinge 30 can be abutted along one or more internal surfaces 54 disposed within the frame 16 in a conductive heat exchange relationship by the first internal heat sink 50 and the second internal heat sink 52. The first internal heat sink 50 and the second internal heat sink 52 can be entirely internal to the frame 16 (i.e. can be disposed within the housing 33 of FIG. 3). Similarly, the onboard electronic components 20A can disposed entirely within the frame 16 (i.e. can be disposed within the housing 33 of FIG. 3) and can carried by the first internal heat sink 50 and the second internal heat sink 52.

The first internal heat sink 50 can be spaced from the second internal heat sink 52. According to the example of FIG. 4, the first internal heat sink 50 can extend generally parallel with the second internal heat sink 52. The first internal heat sink 50 can be configured to hold and to wrap around various boards and/or modules that comprise some of the onboard electronic components 20A. Similarly, the second internal heat sink 52 can be configured to hold and sandwich various boards and/or modules that comprise some of the onboard electronic components 20A.

According to one example, the one or more internal surfaces 54 of the cap hinge 30 and/or other surface of the heat sinks 50, 52 can have TIMs disposed thereon. The TIM can help to provide good thermal contact between the cap hinge 30 and the first internal heat sink 50 and the second internal heat sink 52, for example. The first internal heat sink 50 and the second internal heat sink 52 can additionally utilize TIMs to provide for good thermal contact between the first internal heat sink 50 and the second internal heat sink 52 and the onboard electronic components 20A (e.g., the processor, the WiFi module, the memory, and the image sensor 56) and the heat transfer device 21C. All of these contacts via TIMs allow for heat to be moved rearward or forward through the first internal heat sink 50 and the second internal heat sink 52 to either the cap hinge 30 and on to the core wire 22A or on to the heat pipe 24.

FIG. 4 shows a schematic view of a heat transfer device 100 such as a heat pipe 102. The heat pipe 102 can be thermally coupled to a heat source 104 at a first portion 108A thereof and can be thermally coupled to a heat sink 106 at a second portion 108B thereof. As shown in FIG. 4, the heat pipe 102 can have a hollow central cavity surrounded by an exterior housing. The hollow cavity can contain a working fluid (e.g., deionized water). The working fluid can be evaporated to a vapor at the first portion 108A adjacent the heat source 104. The vapor can travel the length of the heat pipe 102 as illustrated to the second portion 108B. At the second portion 108B adjacent the heat sink 106 the vapor can condense back to fluid and the heat is released to the heat sink 106. The fluid can be absorbed back into a wick 110 that extends substantially the length of the heat pipe 102. The working fluid can travel the length of the wick 110 back from the second portion 108B to the first portion 108A to repeat the cycle described above.

Thus, according to the embodiment of FIG. 4, the heat pipe 102 has a wick 110 that extends along at least a portion of a lateral length thereof. The heat pipe 102 can be configured to carry a working fluid that is evaporated to a vapor at a first lateral end portion 108A thereof by the heat from the heat source 104. The heat pipe 102 can direct the vapor to a second lateral end portion 108B thereof where the vapor condenses back to the working fluid and is absorbed by the wick 110.

A wearable device is disclosed according to one embodiment. The wearable device can include an eyewear body, onboard electronic components, a thermal coupling and a heat transfer device. The eyewear body can be configured for wearing by a user to hold one or more optical elements mounted on the eyewear body within a field of view of the user. The onboard electronic components can be carried by the eyewear body at a first portion of the eyewear body and can comprise a heat source that generates heat during electrically powered operation thereof. The thermal coupling can be thermally coupled to the heat transfer device at a second portion of the eyewear body. The elongate heat transfer device can be disposed within the eyewear body and can be thermally coupled to the heat source and the thermal coupling. The heat transfer device can extend lengthwise between the heat source and the thermal coupling to transfer heat from the heat source to the thermal coupling.

According to another embodiment, a pair of smart glasses is disclosed. The smart glasses can comprise a frame, onboard components, and a heat transfer device. The frame can be configured to hold the one or more optical elements and can have a first lateral portion disposed to a first side of the one or more optical elements and an opposing second lateral portion disposed to a second side of the one or more optical elements. The onboard electronic components can be carried by the frame within the first lateral portion and can comprise a heat source that generates heat during electrically powered operation thereof. The heat transfer device can be carried by the frame and can extend laterally along the frame from the first lateral portion of the frame to the second lateral portion of the frame. The heat transfer device can be thermally coupled the heat source at the first lateral portion and can be configured to transfer the heat from the heat source to the second lateral portion of the frame.

According to another embodiment, a pair of smart glasses is disclosed. The smart glasses can comprise a frame, onboard electronic components, a thermal coupling and a heat transfer device. The frame can be configured to hold the one or more optical elements and can have a first lateral portion disposed to a first side of the one or more optical elements and an opposing second lateral portion disposed to a second side of the one or more optical elements. The onboard electronic components can be carried by the frame within the first lateral portion and can comprise a heat source that generates heat during electrically powered operation thereof. The thermal coupling can be carried by the frame within the second lateral portion. The heat transfer device can be carried by the frame and can extend laterally along the frame from the first lateral portion of the frame to the second lateral portion of the frame. The heat transfer device can be thermally coupled the heat source at the first lateral portion and can be thermally coupled to the thermal coupling at the second lateral portion. The heat transfer device can be configured to transfer the heat from the heat source to the thermal coupling.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:
1. A wearable device comprising:
a frame configured for wearing by a user to hold one or more optical elements mounted on the frame within a field of view of the user;

a first elongate temple moveably connected to the frame with an articulated joint, the first elongate temple configured for holding the frame in position when the frame is worn by the user;

onboard electronic components carried by the frame at a first end portion of the frame that extends longitudinally rearward to interface with a first temple, the onboard electronic components comprising a heat source that generates heat during electrically powered operation thereof, and a heat transfer device disposed within the frame and thermally coupled to the heat source, the heat transfer device configured to transfer heat from the heat source to an interface with the first elongate temple.

2. The wearable device of claim 1, wherein the onboard electronic components are carried by the frame and the heat transfer device extends longitudinally rearward to transfer heat to the first elongate temple.

3. The wearable device of claim 2, wherein the heat transfer device extends lengthwise across the frame between the heat source and a second end portion of the frame that extends longitudinally rearward to interface with a second elongate temple.

4. The wearable device of claim 3, further comprising a first thermal coupling thermally coupled to the heat transfer device at one of the first end portion or the second end portion of the frame, wherein the first thermal coupling comprises one or more of a heat sink, a core wire, and a heat pipe.

5. The wearable device of claim 1, wherein the heat transfer device comprises a core wire configured to form part of a structural framework for at least part of the frame.

6. The wearable device of claim 5, further comprising a second core wire located in at least one of the first elongate temple, and wherein the second core wire is configured to form a part of a structural framework of the first elongate temple.

7. The wearable device of claim 6, further comprising a thermal coupling thermally coupled to the second core wire and the core wire and configured to transfer heat from the core wire of the frame to the second core wire of the first elongate temple.

8. The wearable device of claim 1, wherein the heat transfer device comprises a heat pipe having a wick extending along at least a portion of a lateral length thereof, the heat pipe configured to carry a working fluid that is evaporated to a vapor at a first lateral end portion thereof by the heat from the heat source and direct the vapor to a second lateral end portion thereof where the vapor condenses back to the working fluid and is absorbed by the wick.

9. A pair of smart glasses, the smart glasses comprising:
a frame configured to hold one or more optical elements, the frame having a first lateral portion disposed to a first side of the one or more optical elements and an opposing second lateral portion disposed to a second side of the one or more optical elements;
onboard electronic components carried by the frame within the first lateral portion and comprising a heat source that generates heat during electrically powered operation thereof;
a first temple connected to the frame at the first lateral portion by a first articulated joint; and
a thermal coupling that comprises at least a first portion of the first articulated joint, the thermal coupling having a second portion that forms a rearward facing portion of the frame arranged to generally interface with a forward facing portion of the first temple when worn by user, wherein the thermal coupling configured to conduct the heat away from the frame across the first articulated joint to the first temple.

10. The smart glasses of claim 9, further comprising a heat transfer device carried by the frame and extending laterally along the frame from the first lateral portion of the frame to a second lateral portion of the frame, the heat transfer device thermally coupled to the heat source at the first lateral portion and configured to transfer the heat from the heat source to the second lateral portion of the frame.

11. The smart glasses of claim 10, further comprising:
a second temple connected to the frame at the second lateral portion by a second articulated joint; and
a second thermal coupling comprising least a first portion of the second articulated joint, the second thermal coupling having a second portion carried by the frame and arranged to generally interface an end portion of the second temple, the second thermal coupling configured to conduct the heat away from the heat transfer device across the second articulated joint to the second temple.

12. The smart glasses of claim 10, wherein the heat transfer device comprises a core wire configured to form part of a structural framework for at least part of the frame.

13. The smart glasses of claim 10, wherein the heat transfer device comprises a heat pipe having a wick extending along at least a portion of a lateral length thereof, the heat pipe configured to carry a working fluid that is evaporated to a vapor at a first lateral end portion thereof by the heat from the heat source and direct the vapor to a second lateral end portion thereof where the vapor condenses back to the working fluid and is absorbed by the wick.

14. The smart glasses of claim 9, wherein the thermal coupling comprises one or more of a heat sink, a core wire, and a heat pipe.

15. A pair of smart glasses, the smart glasses comprising:
a frame configured to hold one or more optical elements;
onboard electronic components carried by the frame and comprising a heat source that generates heat during electrically powered operation thereof, and
a heat sink configured to transfer the heat from the heat source to a first articulated joint that connects the frame to a first elongate temple.

16. The smart glasses of claim 15, further comprising a first temple connected to the frame at a first lateral portion by the first articulated joint, wherein the first temple has a core wire configured to form part of a structural framework for at least part of the temple, wherein the core wire comprises a second heat sink configured to transfer the heat from the heat source.

17. The smart glasses of claim 15, wherein the heat sink comprises at least a first portion of the first articulated joint, the heat sink having a second portion carried by the frame and arranged to generally interface an end portion of the first temple.

18. The smart glasses of claim 15, further comprising a heat transfer device carried by the frame and extending laterally along the frame from a first lateral portion of the frame to a second lateral portion of the frame, the heat transfer device thermally coupled to the heat source at the first lateral portion and configured to transfer the heat from the heat source to the second lateral portion of the frame.

19. The smart glasses of claim 18, further comprising:
a second temple connected to the frame at the second lateral portion by a second articulated joint; and
a second heat sink comprising least a first portion of the second articulated joint, the second thermal coupling having a second portion carried by the frame and arranged to generally interface an end portion of the second temple, the second heat sink configured to conduct the heat away from the heat transfer device across the second articulated joint to the second temple.

* * * * *